US006656663B2

United States Patent
Fujiwara

(10) Patent No.: US 6,656,663 B2
(45) Date of Patent: Dec. 2, 2003

(54) MICROLITHOGRAPHIC EXPOSURE METHODS USING A SEGMENTED RETICLE DEFINING PATTERN ELEMENTS EXHIBITING REDUCED INCIDENCE OF STITCHING ANOMALIES WHEN IMAGED ON A SUBSTRATE

(75) Inventor: Tomoharu Fujiwara, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/077,337

(22) Filed: Feb. 15, 2002

(65) Prior Publication Data

US 2002/0150828 A1 Oct. 17, 2002

Related U.S. Application Data

(63) Continuation-in-part of application No. 09/782,590, filed on Feb. 12, 2001, now abandoned.

(30) Foreign Application Priority Data

Feb. 16, 2000 (JP) .................................... 2000-037364
Feb. 15, 2001 (JP) .................................... 2001-038319

(51) Int. Cl.[7] .............................. G03F 9/00; G03C 5/00
(52) U.S. Cl. ......................... 430/296; 430/5; 430/942
(58) Field of Search ............................... 430/296, 311, 430/320, 5, 942

(56) References Cited

U.S. PATENT DOCUMENTS 6,194,102 B1   2/2001   Nakasuji et al. .............. 430/5

Primary Examiner—Christopher G. Young
(74) Attorney, Agent, or Firm—Klarquist Sparkman LLP

(57) ABSTRACT

Microlithographic exposure methods and microelectronic-device fabrication methods are disclosed that include a microlithography step in which a pattern is defined on a segmented reticle. The pattern includes pattern elements split among respective subregions that are exposed onto a resist layer of a wafer or other substrate using a charged-particle-beam (CPB) microlithography apparatus. In a first reticle subregion, a first pattern-element portion is defined having a mating end that is complementary to a mating end of a second pattern-element portion defined in a second reticle subregion. A mating end, rather than simply being blunt, typically has a protrusion and/or recess. If a first mating end has a protrusion, the protrusion is complementary to a corresponding protrusion on a second mating end, or to a recess on the second mating end. A mating end can have both at least one protrusion and at least one recess. Each protrusion narrows to a respective tip that can be rounded or sharp, and has a length of 1 to 5 times the width of the respective pattern-element portion. As transferred to the wafer, the stitched-together elements of the pattern exhibit less variation in line width at connected mating ends.

58 Claims, 11 Drawing Sheets

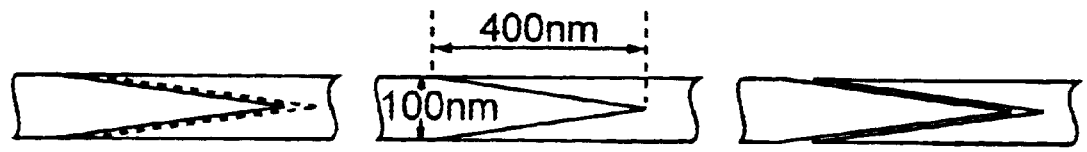
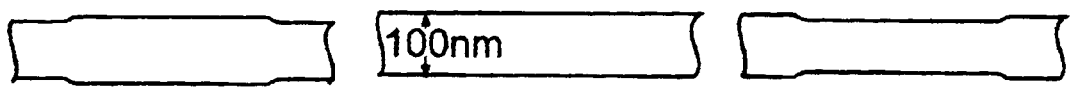
FIG. 5(a)  FIG. 5(b)  FIG. 5(c)
FIG. 5(d)  FIG. 5(e)  FIG. 5(f)
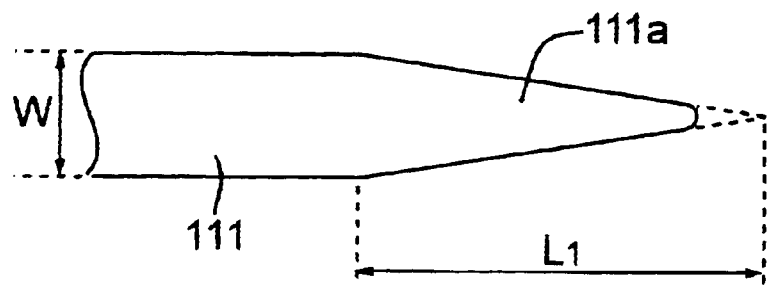
FIG. 6(a)
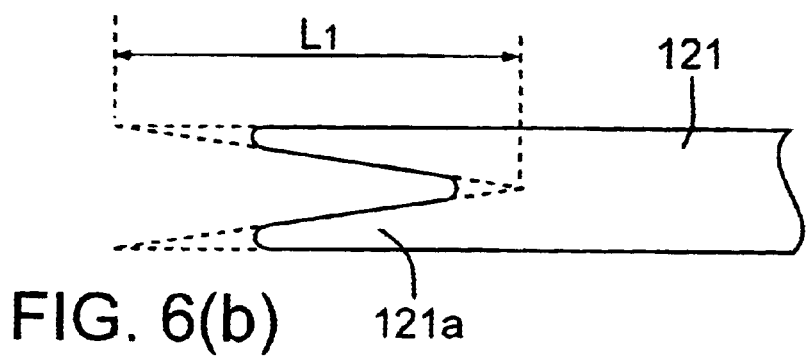
FIG. 6(b)

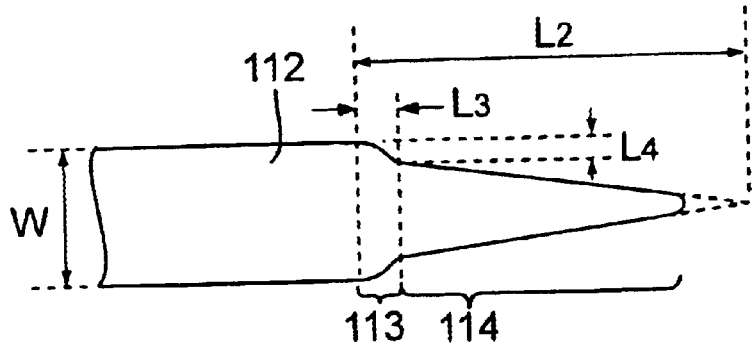
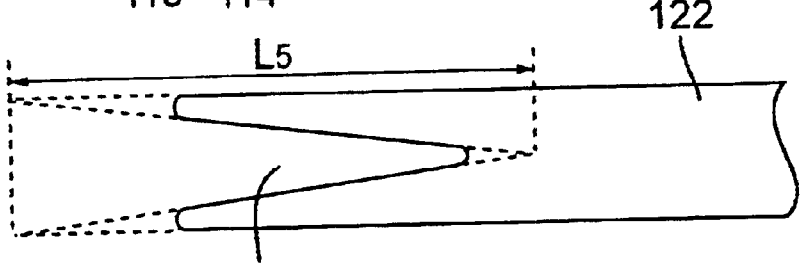
FIG. 7(a)
FIG. 7(b)
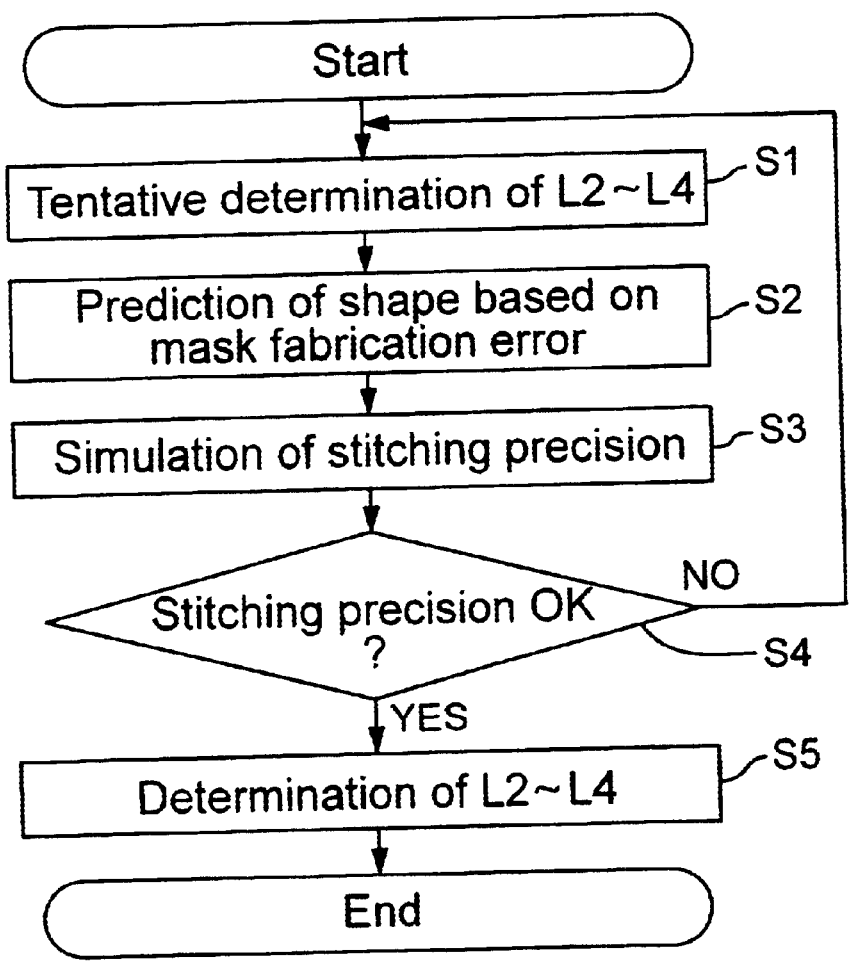
FIG. 8

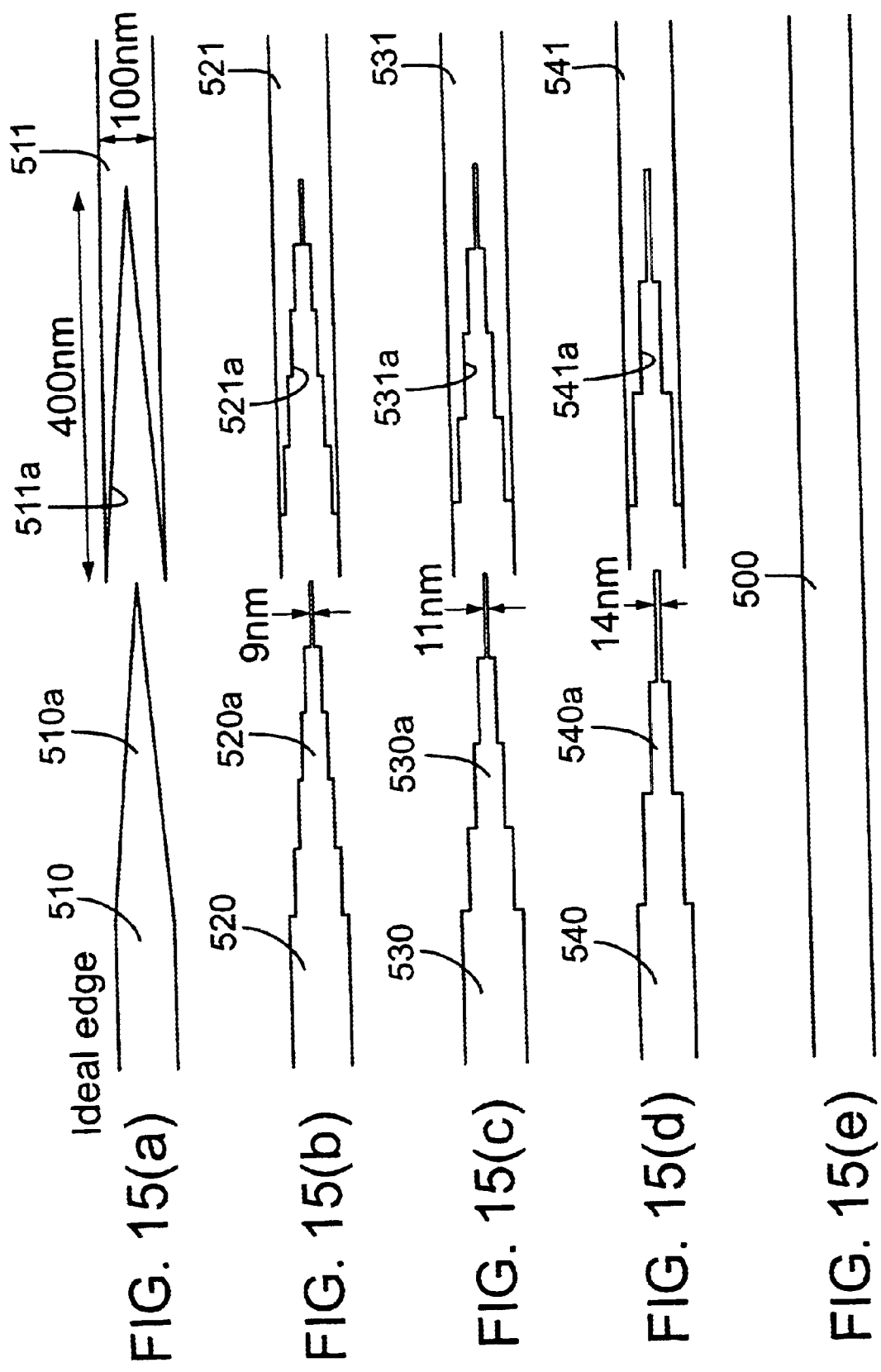

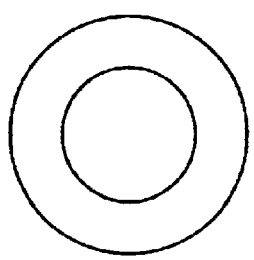
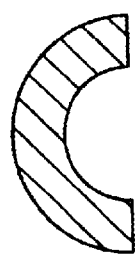
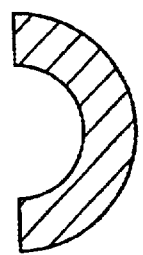
FIG. 16(a) PRIOR ART  FIG. 16(b) PRIOR ART  FIG. 16(c) PRIOR ART
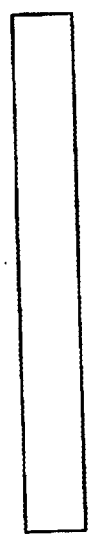
FIG. 17(a) PRIOR ART  FIG. 17(b) PRIOR ART  FIG. 17(c) PRIOR ART
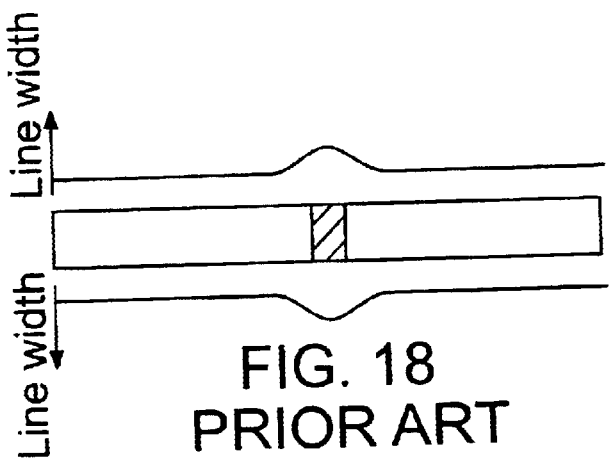
FIG. 18 PRIOR ART

MICROLITHOGRAPHIC EXPOSURE METHODS USING A SEGMENTED RETICLE DEFINING PATTERN ELEMENTS EXHIBITING REDUCED INCIDENCE OF STITCHING ANOMALIES WHEN IMAGED ON A SUBSTRATE

CROSS REFERENCE TO RELATED APPLICATION

This application is a continuation-in-part of U.S. patent application Ser. No. 09/782,590, filed on Feb. 12, 2001 now abandoned.

FIELD

The present invention relates in general to methods for fabricating semiconductor and other microelectronic devices. More specifically, the invention relates to microlithographic methods as used in manufacturing microelectronic devices. The microlithographic methods are performed using a charged particle beam (e.g., electron beam) and a divided mask or reticle (termed "reticle" herein) defining a pattern, wherein the reticle is divided into multiple subregions defining respective portions of the pattern. Dividing the pattern involves splitting certain pattern elements into respective pattern-element portions located in different subregions, wherein exposure of the pattern involves re-joining ("stitching") the pattern-element portions together as the images of the subregions are projected onto the surface of a wafer, thereby forming the complete pattern on the surface of the wafer.

BACKGROUND

Usually, whenever a pattern for a microelectronic device is formed in a resist on the surface of a wafer using an electron-beam exposure (microlithography) apparatus, a stencil reticle is employed. A stencil reticle also is termed a "perforated reticle" in which through-holes in a membrane define respective pattern elements. The through-holes transmit the electron beam in accordance with the respective shapes of the pattern elements. However, there are limits to the area that can be transferred at one time using a single reticle. Furthermore, a "donut" pattern element cannot be defined in a single subregion of a stencil reticle because the middle portion of the element is unsupported and falls out. Moreover, if a pattern element is very large, the stencil reticle portion defining it tends to deform.

Accordingly, for certain pattern elements to be defined using a stencil reticle, the pattern element as designed usually is split into portions defined in separate respective subregions of a reticle. Exposure of the separate subregions is performed successively by irradiation using an electron beam or other charged particle beam. Successive exposure requires that the reticle subregions be successively positioned for exposure using an electron-optical system. Thus, the pattern elements defined by the reticle subregions are transferred to a resist layer on the surface of a wafer. The subregions defining the pattern-element portions are transferred one at a time by deflecting the electron beam, or by moving the respective positions of the reticle and wafer. As a result, the plurality of split pattern elements are exposed adjacent to each other to recreate the entire pattern, as designed, on the wafer.

FIGS. 16(a)–16(c) and 17(a)–17(c) show examples of split pattern elements. In cases where the pattern element is designed as a hollow "donut"-shaped element as shown in FIG. 16(a), the element as defined on the reticle is split into the two portions shown in FIGS. 16(b) and 16(c) to prevent the center portion from dropping out. In cases where the pattern element as designed is a long linear element as shown in FIG. 17(a), the element as defined on the reticle is split into the respective portions shown in FIGS. 17(b) and 17(c) to prevent deformation of the reticle. The element portions are exposed adjacent each other on the wafer so that the entire pattern element as designed is transferred onto the wafer.

Whenever pattern elements are transferred in portions, as described above, there are limits to the accuracy with which the pattern-element portions split on the reticle can be aligned on the surface of the wafer. Accordingly, whenever a plurality of split pattern elements are exposed while being positioned adjacent to each other or overlapped with one another, a considerable amount of positional deviation may occur. Pattern-element deformation caused by such positional deviation is a cause of faulty connections between pattern elements and of wiring interruptions, etc., and is a major problem in the manufacture of modern microelectronic devices having ultra-fine patterns.

A conventional method for preventing breaks in transferred pattern elements involves overlapping the interconnecting portions of the pattern elements, as shown in the shaded areas in FIG. 17. However, whenever portions of pattern elements are overlapped in this manner, the line width of the portions subjected to overlapping exposure is increased, as shown in FIG. 17. Furthermore, as a result of variation in the amount of overlapping caused by positional deviation errors of pattern elements as exposed onto the wafer, the degree of thickening of the line width also varies.

Japan Patent No. 2,706,099 discloses a procedure directed to this problem. Specifically, whenever adjacent portions of a pattern element are connected to each other, a first protruding part (that is smaller than the normal line width of the element in relative terms) is formed at the mating end of one of the portions. A second protruding part having a shape exhibiting linear symmetry with the first protruding part is formed at the mating end of the other portion. However, no approach for optimizing the shapes of the mating ends has been established in cases where the respective shapes of mating ends of pattern elements are finely worked.

In particular, in cases where protruding parts are formed in the mating ends of respective pattern-element portions, and the pattern-element portions are joined together by overlapping the protruding parts of these ends, the widening of the line width in regions of the mating ends subjected to multiple exposure depends greatly on the degree of blur of the exposing beam. Since beam blur of an electron-beam lithographic exposure apparatus varies with changes in the space-charge effect and other phenomena, the dimensions of the protruding parts formed in the mating ends of pattern elements cannot be made the same at all locations on the reticle. Also, the line width varies in areas occupied by mating ends whenever the degree of beam blur varies due to instability of the electron-optical system.

SUMMARY

In light of the above, an object of the invention is to provide microelectronic-device fabrication methods exhibiting reduced variation, in the line width of interconnected mated ends of elements of a pattern, that otherwise occurs whenever the pattern is defined by multiple split-pattern portions on respective portions of a reticle, and a charged-particle-beam lithographic exposure apparatus is used to transfer the split pattern elements onto a resist applied as a coating to a wafer, thereby more reliably connecting the multiple split pattern elements together as imaged on the wafer.

Certain methods according to the invention are directed to respective lithographic processes set forth in the context of a method for manufacturing a microelectronic device. The lithographic processes achieve transfer of a pattern to a resist layer on a wafer. The pattern includes pattern elements split among respective reticle subregions that are exposed onto the resist using a charged-particle-beam lithographic-exposure apparatus that places and stitches together images of the reticle subregions on the wafer to form the pattern on the wafer.

According to a first embodiment, in a first reticle subregion, a first pattern-element portion is defined having a line width and a respective mating end including a protrusion that exhibits increased narrowing of line width toward a distal tip of the protrusion. The protrusion has a length that is 1 to 5 times the line width of the first pattern-element portion. In a second reticle subregion, a second pattern-element portion is defined having a line width and a respective mating end including a recess having a profile that is complementary to the protrusion. The recess has a length that is 1 to 5 times the line width of the second pattern-element portion. Consequently, when the first and second pattern-element portions are exposed onto the resist, the portions collectively form a contiguous pattern element. Using a charged-particle-beam lithographic-exposure apparatus, the first and second reticle subregions are transferred onto the resist in a manner such that the respective mating ends of the first and second pattern-element portions are stitched together in the pattern on the wafer.

The first and second reticle subregions can be on the same or on separate reticles. Also, the protrusion can be shaped such that it progressively narrows toward the distal tip of the protrusion or narrows in a staircase manner toward the distal tip of the protrusion.

According to a second embodiment, in a first reticle subregion, a first pattern-element portion is defined having a line width and a first mating end shaped as a recess flanked by respective protrusions. The protrusions each have a respective rounded tip and a respective width that narrows toward the respective rounded tip. In a second reticle subregion, a second pattern-element portion is defined having a line width and a second mating end that is substantially complementary to the first mating end. The second mating end includes a step region disposed so as to be located, whenever respective images of the first and second pattern-element portions are stitched together, adjacent the respective rounded tips of the protrusions of the first mating end. The second mating end also includes a protrusion extending from the step region and disposed so as to be located, whenever respective images of the first and second pattern-element portions are stitched together, in the recess of the first mating end. Using the charged-particle-beam lithographic-exposure apparatus, the first and second reticle subregions are transferred onto the resist in a manner such that the first and second mating ends are stitched together in the pattern on the wafer. The recess in the first mating end can be defined with a length that is 1 to 5 times the line width of the first pattern-element portion. Similarly, the protrusion of the second mating end can be defined with a length of 1 to 5 times the line width of the second pattern-element portion.

According to a third embodiment, in a first reticle subregion, a first pattern-element portion is defined having a line width and a respective mating end defining a respective protrusion extending at an oblique angle relative to a longitudinal direction of the first pattern-element portion. The protrusion narrows toward a distal tip of the protrusion. In a second reticle subregion, a second pattern-element portion is defined having a line width and a respective mating end defining a respective protrusion extending at an oblique angle relative to a longitudinal direction of the second pattern-element portion. The protrusion has a profile that is complementary to the protrusion of the mating end of the first pattern-element portion. Using the charged-particle-beam lithographic-exposure apparatus, the first and second reticle subregions are transferred onto the resist in a manner such that the respective mating ends of the first and second pattern-element portions are stitched together in the pattern on the wafer. The protrusion of the mating end of the first pattern-element portion can be defined such that the distal tip of the protrusion is rounded. In such an instance, the protrusion of the first pattern-element portion desirably includes a proximal step region situated so as to be adjacent the rounded distal tip of the protrusion of the mating end of the second pattern-element portion whenever the first and second pattern-element portions are stitched together on the wafer. Similarly, the protrusion of the mating end of the second pattern-element portion can be defined such that the distal tip of the protrusion is rounded. In such an instance, the protrusion of the second pattern-element portion desirably includes a proximal step region situated so as to be adjacent the rounded distal tip of the protrusion of the mating end of the first pattern-element portion whenever the first and second pattern-element portions are stitched together on the wafer. The protrusion of the first pattern-element portion desirably is defined with a length of 1 to 5 times the line width of the first pattern-element portion. Similarly, the protrusion of the second pattern-element portion desirably is defined with a length of 1 to 5 times the line width of the second pattern-element portion.

According to a fourth embodiment, in a first reticle subregion, a first pattern-element portion is defined having a line width and a respective mating end including a respective protrusion having an edge extending obliquely to a length dimension of the first pattern-element portion. The protrusion includes a respective recess. In a second reticle subregion, a second pattern-element portion is defined having a line width and a respective mating end that is complementary to the mating end of the first pattern-element portion. Using the charged-particle-beam lithographic-exposure apparatus, the first and second reticle subregions are transferred onto the resist in a manner such that the respective mating ends of the first and second pattern-element portions are stitched together in the pattern on the wafer.

The recess defined in the protrusion of the mating end of the first pattern-element portion can be configured to divide the respective protrusion into first and second protrusion portions that flank the recess, wherein each protrusion portion has a respective rounded distal end. The mating end of the second pattern-element portion can be defined to include a respective protrusion having an edge extending obliquely to a length dimension of the second pattern-element portion. The protrusion desirably includes a recess that divides the respective protrusion into first and second protrusion portions that flank the recess, wherein each protrusion portion has a respective rounded distal end. In the mating end of the first pattern-element portion, the obliquely extending edge desirably includes a respective step region situated so as to be located adjacent a rounded tip of a protrusion portion of the mating end of the second pattern-element portion when the first and second pattern-element portions are stitched together on the wafer. Similarly, in the mating end of the second pattern-element portion, the obliquely extending edge desirably includes a respective step region situated so as to be located adjacent a rounded tip of a protrusion portion of the mating end of the first pattern-element portion when the first and second pattern-element portions are stitched together on the wafer. The recess defined in the protrusion of the mating end of the first pattern-element portion desirably is defined to have a length of 1 to 5 times the line width of the first pattern-element portion.

In the methods described above, portions of pattern elements (i.e., regions of pattern elements where respective pattern-element portions are joined together as projected on the wafer) can be subjected to double exposure due to positional errors. However, undesirable consequences of such double exposures, such as line-width thickening or line-width narrowing, or breaks in pattern elements, are reduced by configuring the mating ends of pattern-element portions (according to certain aspects of the invention) so as to fit together in a complementary manner when projected onto the wafer. Even under conditions of variable beam blur of the lithographic apparatus, line-width variation is reduced, yielding more accurate pattern transfer.

The foregoing and additional features and advantages of the invention will be more readily apparent from the following detailed description, which proceeds with reference to the accompanying drawings.

BRIEF DESCRIPTION OF THE DRAWINGS

FIGS. 5(a)–5(f) are respective plan views illustrating respective variations in the line width of a pattern element as transferred to the resist. The variations occur due to respective amounts of overlapping of the pattern-element portions as projected from two respective reticle subregions. The pattern-element portions are configured as shown in FIGS. 1(a)–1(c).

FIGS. 6(a)–6(b) are respective plan views illustrating respective pattern-element portions having mating end that are rounded due to a fabrication error of the reticle-drawing apparatus.

FIGS. 7(a)–7(b) are respective plan views illustrating the splitting of a pattern element as used in a microelectronic-device fabrication method according to a second representative embodiment.

FIG. 8 is a flow chart illustrating an exemplary simulation used for optimizing the design shape parameters for pattern elements in the second representative embodiment.

FIGS. 15(a)–15(d) are respective plan views illustrating the splitting of a linear pattern element as used in a microelectronic-device fabrication method according to a fifth representative embodiment; and FIG. 15(e) shows the result after projection of the stitched linear pattern element onto the surface of a wafer.

FIG. 16(a) is a plan view of a conventional hollow ("donut") pattern element, and FIGS. 16(b)–16(c) are respective plan views of respective pattern-element portions conventionally obtained by splitting the donut pattern element.

FIG. 17(a) is a plan view of a conventional long linear pattern element, and

FIGS. 17(b)–17(c) are respective plan views of respective pattern-element portions conventionally obtained by splitting the linear pattern element.

FIG. 18 is a plan view illustrating the thickening of the line width of conjoined pattern-element portions in a double-exposed region portion conventionally resulting from the overlapping of the respective mating ends of the pattern-element portions.

DETAILED DESCRIPTION

The disclosure below is set forth in the context of representative embodiments that are not intended to be limiting in any way.

First Representative Embodiment

Figure 1A:
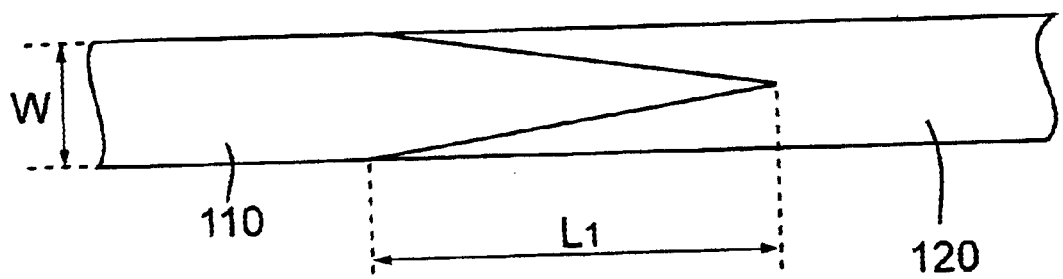
FIGS. 1(a)–1(c) are respective plan views illustrating the splitting of a pattern element as used in a microelectronic-device fabrication method according to a first representative embodiment.
Figure 1B:
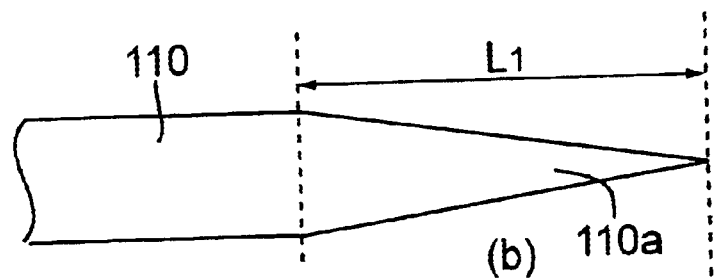
Figure 1C:
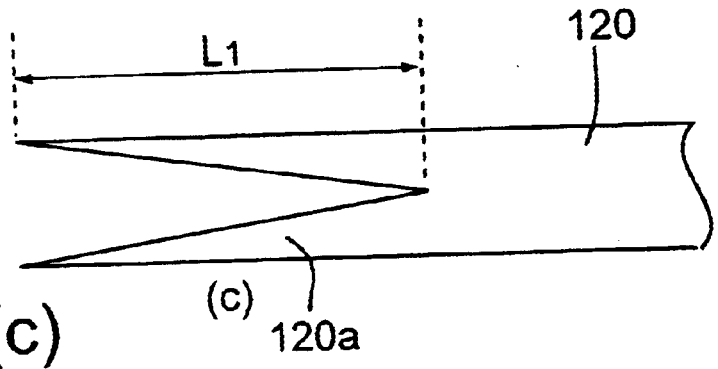

A first representative embodiment is shown in FIGS. 1(a)–1(c), showing splitting of a long linear pattern element (FIG. 1(a)) into two complementary pattern-element portions 110, 120 (FIGS. 1(b) and 1(c), respectively). The pattern-element portions 110, 120 are defined in respective subregions of the reticle (or in respective subregions of separate reticles). The portion 110 has a protruding mating end 110a, and the portion 120 has a recessed mating end 120a shaped to be complementary to the mating end 110a. The dimensions of these features will be described in detail later. The respective reticle subregion defining the pattern-element portion 110 and the respective reticle subregion defining the pattern-element portion are successively irradiated with an electron beam (or other charged particle beam) to transfer the respective pattern-element portions onto a resist layer formed on the surface of a wafer. The pattern-element portions 110, 120 can delimit a region such as a gate electrode, impurity-diffusion region, wiring, etc., of a microelectronic device formed on the wafer.

Figure 2:
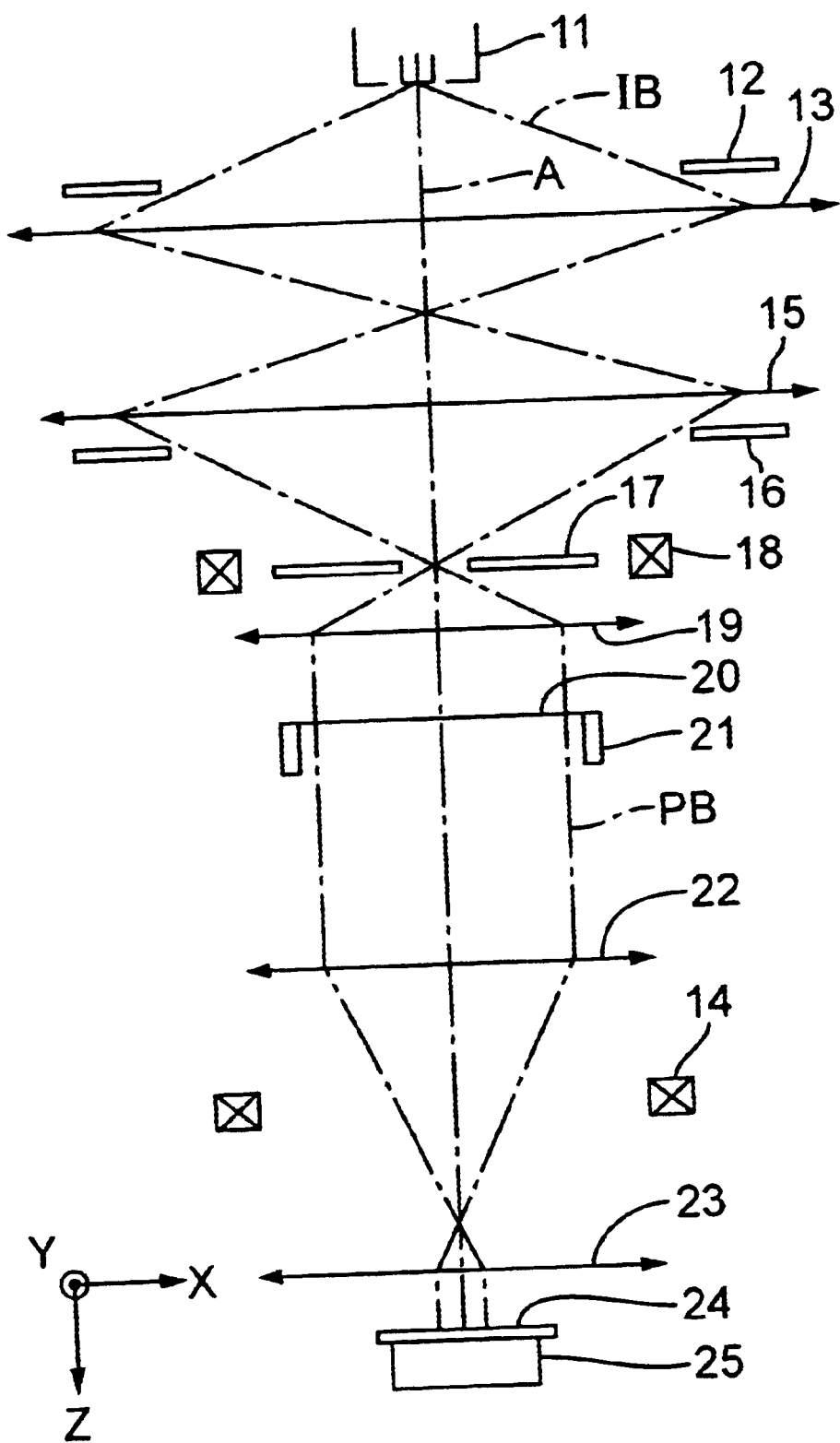
FIG. 2 is an optical diagram illustrating image-focusing relationships in the electron-optical system of an electron-beam lithographic exposure apparatus.

A representative electron-beam exposure apparatus used to perform this exposure (and generally exposures according to other embodiments) is described with reference to FIG. 2. FIG. 2 also shows optical relationships of certain components with each other. An electron gun 11 emits an electron beam IB in a downstream direction along an axis A. Two condenser lenses 13 and 15 are situated downstream of the electron gun 11. The electron beam IB passes through the condenser lenses 13, 15, and forms a crossover on the axis A in an aperture defined by a blanking diaphragm 17. The current density with which the reticle 20 is irradiated can be varied by operating the two condenser lenses 13, 15 in concert as a zoom lens.

Two diaphragms 12, 16 defining respective rectangular apertures (subfield-limiting apertures) are disposed above and below the condenser lenses 13, 15, respectively. These rectangular apertures transmit only a portion of the electron beam IB sufficient to illuminate one subregion (also termed a "subfield") of the reticle 20 contained in a main optical field of the electron-optical system. The image formed by the aperture of the first diaphragm 12 is focused on the second diaphragm 16 by the condenser lenses 13, 15.

A subfield-selection deflector 18 is disposed adjacent the blanking diaphragm 17. The subfield-selection deflector 18 successively scans the electron beam 18 mainly in the X direction, and exposes a plurality of subfields arrayed in the X direction within the main optical field. A condenser lens 19 is disposed beneath the subfield-selection deflector 18. The condenser lens 19 collimates the electron beam IB and directs the collimated beam onto the reticle 20, thereby forming an image of the aperture of the second diaphragm 16 on the reticle 20.

The electron-optical system, described above, located between the electron gun 11 and the reticle 20 is the "illumination-optical system" used to direct the electron beam IB ("illumination beam") onto the reticle 20. Downstream of the reticle 20 is a "projection-optical system" used to direct a "patterned beam" PB (formed by passage of electrons of the illumination beam IB through the reticle 20) from the reticle 20 to a wafer 24. The projection-optical system includes two projection lenses (objective lenses) 22, 23 and an image-positioning deflector 14 disposed between the projection lenses 22, 23.

In the electron-beam exposure apparatus of FIG. 2, the subfield-selection deflector 18 deflects the electron beam IB as required to cause the electron beam IB to strike the reticle subregions in a sequential manner at high speed. Meanwhile, the image-positioning deflector 14 deflects the patterned beam PB as required to position the projected images of the subregions adjacent each other in coordination with appropriate movement of a wafer stage 25 on which the wafer 24 is mounted for exposure.

To eliminate having to provide a large deflection range of the illumination beam IB, the reticle 20 is mounted to a reticle stage 21 that is movable in the X direction and Y direction. As noted above, the wafer 24 is mounted on a wafer stage 25 that can move in the X direction and the Y direction. On the reticle 20, the subregions (subfields) are arrayed in parallel rows (each extending in the X direction). Multiple rows are arrayed in the Y direction in groups called "stripes." Multiple stripes form the reticle pattern. The constituent rows in each stripe are successively placed for exposure by moving the reticle stage 21 and wafer stage 25 in opposite Y directions. The stripes are successively exposed by intermittently moving the reticle stage 21 and wafer stage 25 in the X direction. Moreover, the reticle stage 21 and wafer stage 25 are each equipped with accurate position-measurement systems employing laser interferometers. The respective rows and subfields are accurately joined together on the wafer 24 as required by appropriate adjustments of beam position using a separate alignment means or deflector.

Whenever a subfield of the reticle 20 is being illuminated by the illumination beam IB, the resulting patterned beam PB is reduced (demagnified) by the projection lenses 22, 23 and deflected as required to focus an image of the subfield at a specified location on the wafer 24. The surface of the wafer 24, on which an appropriate conductive film or insulating film has been formed, is coated with a suitable resist. In areas of the resist subjected to a patterned-beam dose exceeding a specified threshold, the resist can be made more durable than unexposed resist and caused to remain (in the case of a negative resist) on the wafer after resist development. Thus, the pattern defined by the reticle 20 is transferred to the resist on the wafer 24.

The line width of a pattern element transferred to the resist varies mainly as a result of positional deviations of the pattern element on the wafer attributable to a positional error $E_1$ caused by the deflectors of the projection-optical system and to a positional error $E_2$ of the reticle stage 21 and wafer stage 25. FIGS. 3(a)–3(f) show exemplary variations in the line width of a linear pattern element transferred to the resist, as affected by the amount of overlapping of respective pattern-element portions projected from two respective subregions of the reticle 20. Here, the design-specified line width of the linear pattern element is 0.1 $\mu$m (100 nm).

Figure 3A:
FIGS. 3(a)–3(f) are respective plan views illustrating respective variations in the line width of a pattern element as transferred to the resist. The variations occur due to respective amounts of overlapping of the pattern-element portions as projected from two respective reticle subregions. The pattern-element portions are configured as shown in FIG. 17(a).
Figure 3B:
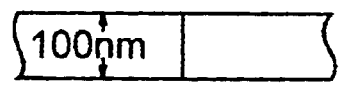
Figure 3C:
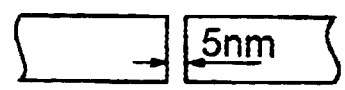
Figure 3D:
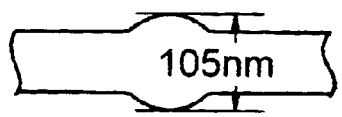
Figure 3E:
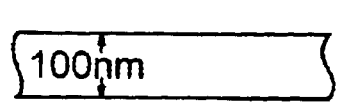
Figure 3F:
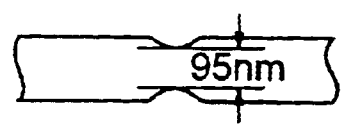

If the amount of overlapping of the projected pattern-element portions is zero as shown in FIG. 3(b), then the line width of the transferred pattern element is unchanged at 100 nm as shown in FIG. 3(e). If the projected pattern-element portions overlap by 5 nm as shown in FIG. 3(a), then the line width of the transferred pattern element in the connected region is increased ("thickened") to 105 nm as shown in FIG. 3(d). Conversely, if the projected pattern-element portions are "underlapped" by 5 nm as shown in FIG. 3(c), then the line width of the transferred pattern element in the connected region is decreased (narrowed) to 95 nm as shown in FIG. 3(f). Accordingly, whenever it is desired to control the amount of line-width variation in the connected region of a transferred pattern element to ±5% or less, the positional errors $E_1$ and $E_2$ for the respective projected pattern elements as achieved by the electron-beam exposure apparatus should not exceed $\pm(5/\sqrt{2})=\pm3.5$ nm. This represents an extremely strict accuracy requirement for pattern-element positioning.

Figure 4A:
FIGS. 4(a)–4(i) are respective plan views illustrating respective variations in the line width of a pattern element as transferred to the resist. The variations occur due to respective amounts of overlapping of the pattern-element portions as projected from two respective reticle subregions. The pattern-element portions have protruding parts on their respective mating ends.
Figure 4B:
Figure 4C:
Figure 4D:
Figure 4E:
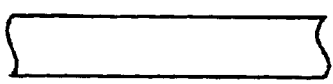
Figure 4F:

FIGS. 4(a)–4(i) show variations in the line width of a transferred linear pattern element as a function of the amount of overlapping of constituent pattern-element portions as projected from two respective subregions of the reticle, in a case in which the pattern-element portions have protrusions on their respective mating ends. By optimizing the dimensions of the protrusions in accordance with the amount of beam blur exhibited by the electron beam produced by the electron-beam exposure apparatus, it is possible to obtain an unchanged line width on the transferred pattern element, as shown in FIG. 4(e). For example, this line width is design-specified at 100 nm, and is achieved where the amount of overlapping of the projected pattern-element portions is a standard design-specified amount, as shown in FIG. 4(b). If the projected pattern-element portions overlap more than the standard design-specified amount (FIG. 4(a)), then the resulting increase in the line width of the transferred pattern element (FIG. 4(d)) is comparatively small (compare FIG. 4(d) with FIG. 3(d)). Under such conditions, even if a positional error of approximately +13 nm occurs in the projected pattern-element portions, the increase in the line width of the transferred pattern element can be kept to approximately +5%. Conversely, if the projected pattern-element portions are overlapped less (FIG. 4(c)) than the standard design-specified amount, then the connecting region is still subjected to double exposure, as shown in FIG. 4(f). As a result, so that there is very little risk of the transferred pattern element being broken or interrupted.

Figure 4G:
Figure 4H:
Figure 4I:
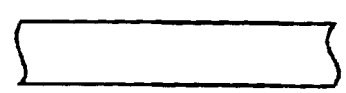

In an electron-beam exposure apparatus, beam blur varies with changes in pattern-element density of the pattern, beam-deflection position, and other parameters. Whenever a large amount of beam blur is present, transferred pattern elements formed by conjoining respective pattern-element portions are thickened in the respective connecting regions, as shown in FIG. 4(h), even if the amount of overlap is the standard design-specified amount (FIG. 4(b)). Whenever the projected pattern-element portions are overlapped more than the standard design-specified amount, (FIG. 4(a)), the line width of the connection region of the transferred pattern element is thickened even more, as shown in FIG. 4(g). In such cases, it is necessary to cause the projected pattern-element portions to overlap less than the standard design-specified amount, as shown in FIG. 4(c), so as to produce the desired transfer-pattern element, as shown in FIG. 4(i).

FIGS. 5(a)–5(f) show variations in the line width of a transferred linear pattern element as a function of the amount of overlapping of constituent pattern-element portions as projected from respective subregions of the reticle, in a case in which the pattern-element portions are as shown in FIGS. 1(a)–1(c). Here, the design-specified line width W of the pattern element in FIG. 1(a) is 0.1 $\mu$m (100 nm), and the length $L_1$ of the protrusion 110a (FIG. 1(b)) and of the complementary mating end 120a (FIG. 1(c)) is 400 nm.

Whenever the overlap of the projected pattern-element portions is just zero as shown in FIG. 5(b), the line width of the transferred pattern element is unchanged at the desired 100 nm, as shown in FIG. 5(e). Whenever the projected pattern-element portions overlap (due to an error in pattern-element positioning on the wafer), as shown in FIG. 5(a), a slight thickening of the line width of the transferred pattern element is evident. The thickened line width is dispersed in the longitudinal direction of the pattern element. Consequently, the variation in the line width of the transferred pattern element is relatively small, as shown in FIG. 5(d). Conversely, if the projected pattern-element portions actually have an intervening space between the respective mating ends (a condition termed "underlap" due for example to an error in pattern-element positioning on the wafer), as shown in FIG. 5(c), a slight narrowing of the line width of the transferred pattern element is evident. The narrowed line width is dispersed in the longitudinal direction of the pattern element. Consequently, the variation in the line width of the transferred pattern element is relatively small, as shown in FIG. 5(f). Based on these results, the variation in line width of the transferred pattern is ±5% or less, even if the positional error of the projected pattern elements is approximately ±20 nm.

Referring further to the case of zero overlap as shown in FIG. 5(b), continuity of desired line width of the transferred pattern element is obtained regardless of beam blur. Even if adjoining pattern-element portions overlap or underlap, the variation in the line width of the transferred pattern element caused by variation in beam blur is dispersed longitudinally over the pattern element. This provides a pattern-element line width that is extremely stable to positional errors of the pattern and to beam blur.

In view of the foregoing, a large value of the length $L_1$ (FIG. 1(a)) is desirable. However, as $L_1$ increases, the apex of the protrusion 110a (and the deepest portion of the complementary portion 120a) have increasingly sharper angles. These trends increase the difficulty of reticle fabrication. Using current fabrication techniques the length $L_1$ can be increased to approximately 500 nm. In general, it is appropriate to establish the length $L_1$ at 1 to 5 times the design-specified line width W of the pattern element.

Second Representative Embodiment

A second representative embodiment of a microelectronic-device fabrication method is directed to situations in which the acute angles of mating ends of pattern-element portions are blunted or rounded. Mating ends having these configurations can arise as a result of reticle-fabrication errors and/or problems in reticle drawing. Exemplary rounded mating ends 111a, 121a are shown in FIGS. 6(a)–6(b), respectively. In an attempt to interconnect ("stitch together") the mating ends having such configurations, obtaining the required interconnection accuracy is very difficult to impossible.

Under such conditions, and also taking into account errors that occur during reticle fabrication, optimization of the interconnection of pattern-element portions is performed, according to this embodiment, in a manner as shown in FIGS. 7(a)–7(b). Specifically, the pattern-element portion 112 shown in FIG. 7(a) includes step regions 113 having dimensions $L_3$ and $L_4$ as shown. The pattern-element portion 112 also includes a protrusion 114 that is contiguous with the step regions 113. These features improve the stitching of the pattern-element portion 112 (FIG. 7(a)) with the pattern-element portion 122 (FIG. 7(b)). The total length of the step regions 113 plus the protrusion 114 (including the portions indicated by dashed line in FIG. 7(a) is designated as $L_2$. Since the complementary recession 122a in the mating end of the pattern-element portion 122 also is shortened due to blunting, the length $L_1$ shown in FIG. 1(a) is corrected in FIG. 7(b) to the length $L_5$ during the design of the pattern-element portion 122. The shape of the pattern-element portion 112 in FIG. 7(a) is designed on the basis of the corrected length $L_5$. Note that rounded acute angles occur at three places in the pattern-element portion 122.

The design-specified parameters $L_2$, $L_3$, $L_4$, etc., of the pattern-element portion 112 can be optimized by a simulation protocol as outlined in FIG. 8. First, in step S1, the shape of a pattern-element portion is "tentatively" determined without considering reticle-fabrication errors. In this step, the parameters $L_2$–$L_4$ are predicted beforehand. Next, in step S2, reticle-fabrication errors are applied to the tentatively determined shape of the pattern-element portion. Also, the shape of the pattern-element portion in the reticle being fabricated is predicted. The reticle-fabrication errors include the beam blur occurring in the reticle-drawing apparatus, minimum address size, and other factors. For example, by approximating beam blur of the reticle-drawing apparatus using a Gaussian distribution, it is possible to calculate the shape of a pattern-element portion in the reticle from a convolution of the design-specified pattern and the Gaussian distribution.

Next, in step S3, the stitching accuracy of pattern-element portions is determined by simulation. In this simulation, a first calculation involves a convolution of the pattern-element portion predicted in step S2 and beam blur of the electron-beam exposure apparatus. This calculation is respectively performed for the pattern-element portion 112 (FIG. 7(a)) and the pattern-element portion 122 (FIG. 7(b)). Subsequently, it is assumed that the pattern-element portion 112 and the pattern-element portion 122 are disposed in specified respective locations for stitching together. Stitching accuracy is determined by calculating the line width of the pattern element formed on the wafer, based on the electron-beam dose applied to the resist on the wafer.

In step S4, stitching accuracy is determined on the basis of the results obtained in step S3. In cases where stitching accuracy does not satisfy a specified standard, the process returns to step S1, and calculations are repeated with appropriate changes to the parameters $L_2$–$L_4$. Thus, a pattern-element portion having an optimal shape, taking into consideration the fabrication error of the reticle-drawing apparatus, can be determined from the parameters $L_2$–$L_4$.

Third Representative Embodiment

Figure 9A:
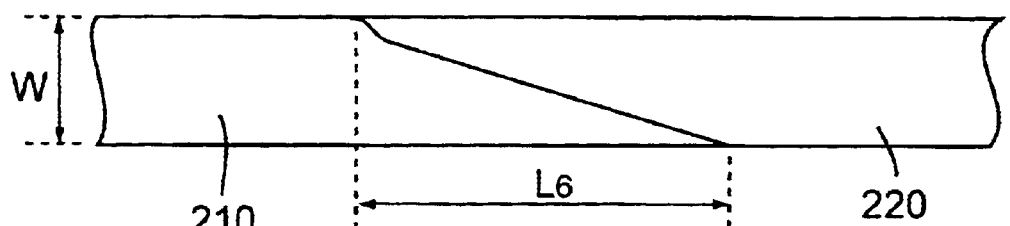
FIGS. 9(a)–9(c) are respective plan views illustrating the splitting of a pattern element as used in a microelectronic-device fabrication method according to a third representative embodiment.
Figure 9B:
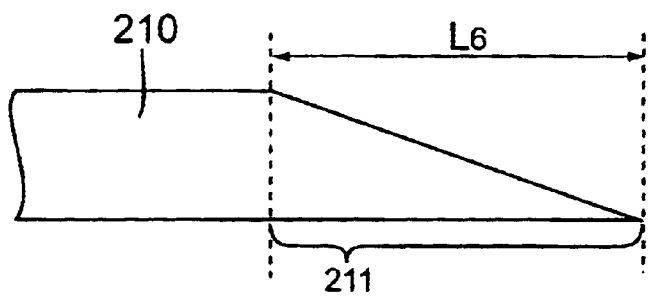
Figure 9C:
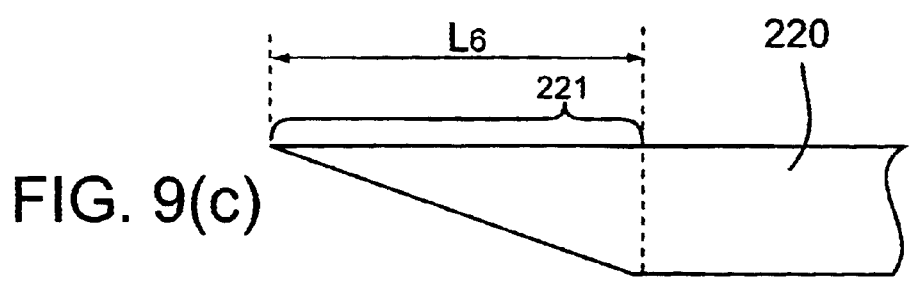

A microelectronic-device fabrication process according to a third representative embodiment now is described with reference to FIGS. 9(a)–9(c). FIG. 9(a) depicts a long linear pattern element that is split into respective pattern-element portions 210, 220 shown in FIGS. 9(b)–9(c), respectively. The pattern-element portions 210, 220 are defined in respective subregions of a reticle (or on separate reticles). The pattern-element portion 210 has a mating end 211 that is cut at an oblique angle with respect to the length of the pattern-element portion. The pattern-element portion 220 has a similar but complementary mating end 221. The pattern-element portions 210, 220 are connected (stitched) together at such mating ends when the respective reticle subregions are projected onto the wafer. Variations in line width of the resulting pattern element are substantially reduced in the same manner as in the first representative embodiment, even if the amount of overlap of the two pattern-element portions varies.

FIGS. 10(a)–10(f) show variations in line width of the pattern element formed from stitching together of the pattern-element portions 210, 220 as transferred to the resist, as a function of the amount of overlap of the respective mating ends. Here, the design-specified line width W of the pattern element shown in FIG. 9(a) is, for example, 0.1 μm (100 nm), and the length $L_6$ of the oblique mating ends 211, 221 is 400 nm.

Figures 10A, 10B, 10C:
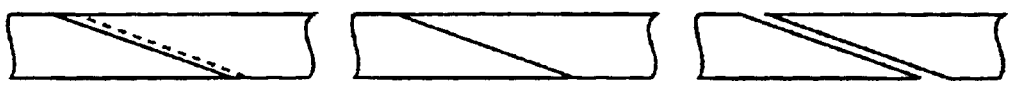
FIGS. 10(a)–10(f) are respective plan views illustrating respective variations in the line width of a pattern element as transferred to the resist. The variations occur due to respective amounts of overlapping of the pattern-element portions as projected from two respective reticle subregions. The pattern-element portions are configured as shown in FIGS. 9(a)–9(c).
Figures 10D, 10E, 10F:
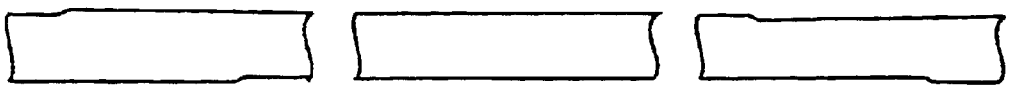

Whenever the amount of overlap of the projected pattern-element portions is zero as shown in FIG. 10(b), the line width of the resulting pattern element, as transferred to the wafer is unchanged at the desired 100 nm as shown in FIG. 10(e). Whenever the respective mating ends of the projected pattern-element portions overlap, as shown in FIG. 10(a), due to a positioning error, the line width of the resulting pattern element as transferred to the wafer exhibits some thickening as shown in FIG. 10(d). The thickening is dispersed in the longitudinal direction of the pattern element, yielding a relatively small variation in the line width.

Conversely, whenever the projected pattern-element portions "underlap," as shown in FIG. 10(c), due to a positioning error, the line width of the resulting pattern element as transferred to the wafer exhibits some narrowing, as shown in FIG. 10(f). The narrowing is dispersed in the longitudinal direction of the pattern element, yielding a relatively small variation in line width.

Since the thickened regions of the transferred pattern element are longitudinally shifted along the upper and lower edges, as shown in FIG. 10(d), the variation in line width of the pattern element is smaller than in the first representative embodiment. A similar phenomenon is evident in the transferred pattern element shown in FIG. 10(f), but characterized by narrowing rather than thickening. The desired range for the length $L_6$ is similar to the desired range for the length $L_1$ in the first representative embodiment.

Figure 11A:
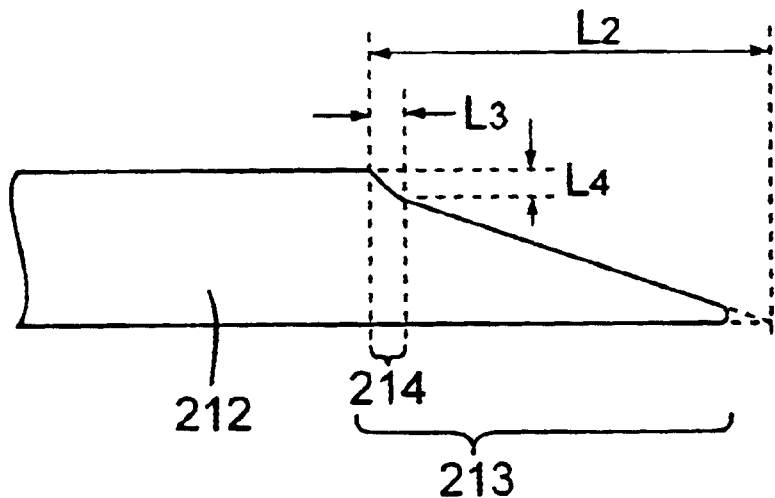
FIGS. 11(a)–11(b) are respective plan views illustrating the splitting of a pattern element as used in a modification of the third representative embodiment.
Figure 11B:
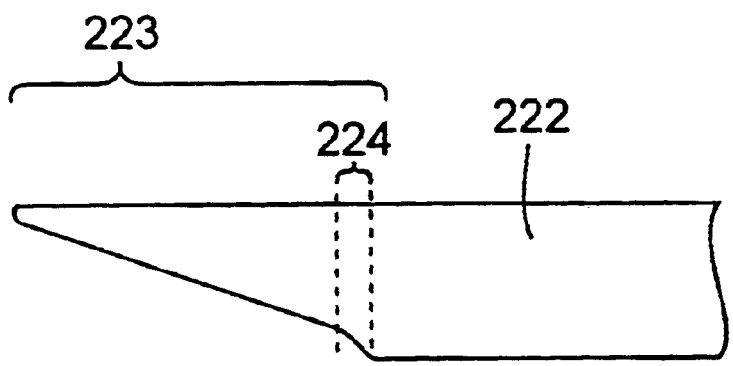

Further with respect to this embodiment, the design of pattern-element portions may be performed with appropriate consideration given to the rounding of the tips of mating ends (caused by fabrication errors originating in the performance of the reticle-drawing apparatus), in the same manner as in the second representative embodiment. Modifications to the shapes of the respective mating ends are shown in FIGS. 11(a)–11(b), respectively. I.e., if the oblique part 213 of the pattern-element portion 212 (FIG. 11(a)) and the oblique part 223 of the pattern-element portion 222 (FIG. 11(b)) have rounded tips, the first pattern-element portion is defined in its reticle subregion such that the oblique part 213 has a step 214 in a location corresponding to the position of the rounded tip of the oblique part 223. Similarly, the second pattern-element portion is defined in its reticle subregion such that the oblique part 223 has a step 224 in a location corresponding to the position of the rounded tip of the oblique part 213. The design-specified parameters $L_2$–$L_4$, etc., of the pattern-element portions 212, 222 can be optimized using, for example, a simulation as shown in FIG. 8.

Fourth Representative Embodiment

Figure 12A:
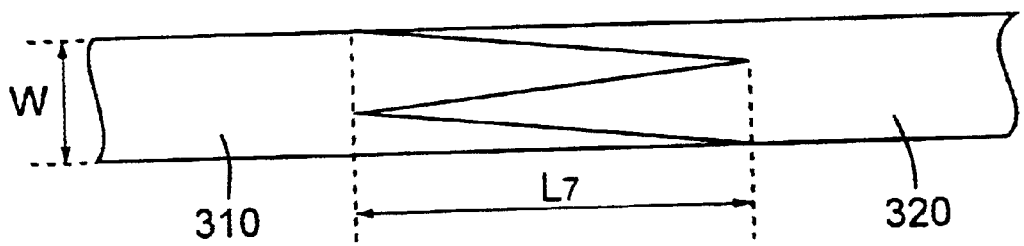
FIGS. 12(a)–12(c) are respective plan views illustrating the splitting of a pattern element as used in a microelectronic-device fabrication method according to a fourth representative embodiment.
Figure 12B:
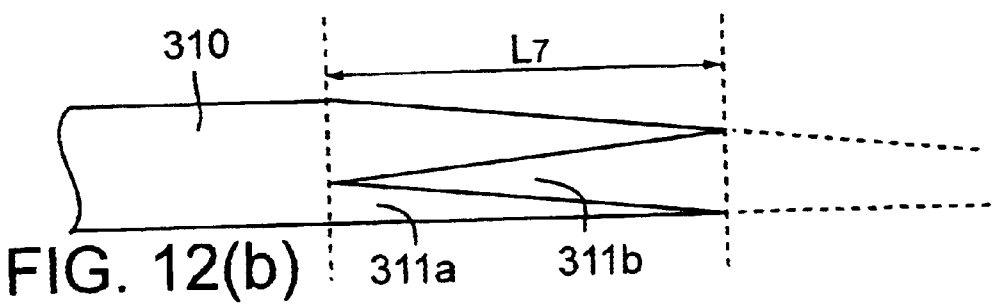
Figure 12C:
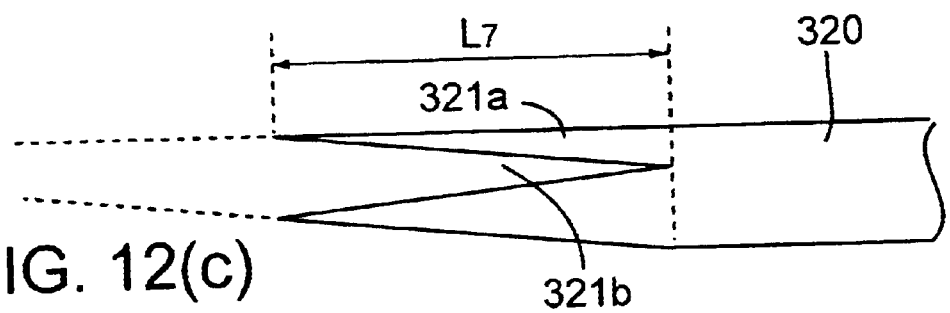

FIGS. 12(a)–12(c) depict a manner of stitching together two long linear pattern-element portions according to the fourth representative embodiment. The pattern element as designed has a long linear profile similar to that shown in FIG. 12(a). This pattern element is split into two complementary pattern-element portions 310 and 320, shown in FIGS. 12(b) and 12(c), respectively, defined on separate reticle subregions of the same reticle or of different reticles. The mating end of the pattern-element portion 310 includes an oblique part 311a and a recession 311b. The mating end of the pattern-element portion 320 is complementary to the mating end of the pattern-element portion 310. By configuring respective mating ends in this manner, variations in line width of the pattern element that are formed when the pattern-element portions 310, 320 are stitched together on the wafer can be kept very small, similar to the first representative embodiment, even in the face of variations in the amount of overlap of the mating ends.

FIGS. 13(a)–13(f) depict various conditions of overlap and the consequences thereof, using the pattern-element portions shown in FIGS. 12(b) and 12(c). By way of example, the design-specified line width W of the pattern-element portions shown in FIG. 12(a) is 0.1 μm (100 nm), and the length $L_7$ of the mating ends is 400 nm.

Figure 13A:
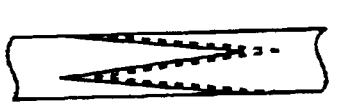
FIGS. 13(a)–13(f) are respective plan views illustrating respective variations in the line width of a pattern element as transferred to the resist. The variations occur due to respective amounts of overlapping of the pattern-element portions as projected from two respective reticle subregions. The pattern-element portions are configured as shown in FIGS. 12(a)–12(c).
Figure 13B:
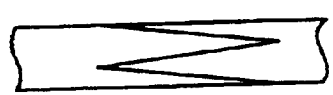
Figure 13C:
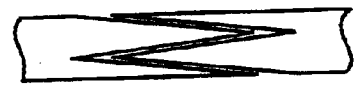
Figure 13D:
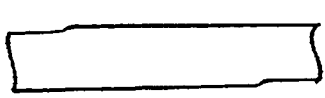
Figure 13E:
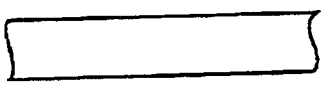

Whenever the amount of overlap of the mating ends as projected onto the wafer is zero as shown in FIG. 13(b), the line width of the transferred pattern element is unchanged at the desired 100 nm, as shown in FIG. 13(e). Whenever the mating ends overlap due to a positioning error of the pattern-element portions as projected, as shown in FIG.

Figure 13F:
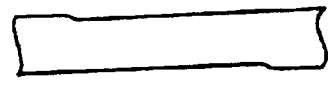

13(a), the line width of the transferred pattern element is thickened slightly. The thickening is dispersed longitudinally, yielding a very small variation in the line width of the transferred pattern element, as shown in FIG. 13(d). Whenever the mating ends exhibit "underlap" due to a positioning error, as shown in FIG. 13(c), the line width of the transferred pattern element is narrowed slightly. The narrowing is dispersed longitudinally, yielding a very small variation in the line width of the transferred pattern element, as shown in FIG. 13(f).

In FIG. 13(d), the thickened regions are shifted longitudinally relative to each other on the "upper" and "lower" edges of the transferred pattern element. Consequently, the variation in line width is smaller than the variation obtained with the first representative embodiment. Similarly, in FIG. 13(f), the narrowed portions are shifted longitudinally relative to each other on the "upper" and "lower" edges of the pattern element. Thus, if the two pattern-element portions 310, 320 are shifted relative to each other in the longitudinal direction, the probability of a break in the pattern element is very low. The preferred range of the length $L_7$ is similar to the range for the length $L_1$ in the first representative embodiment.

Figure 14A:
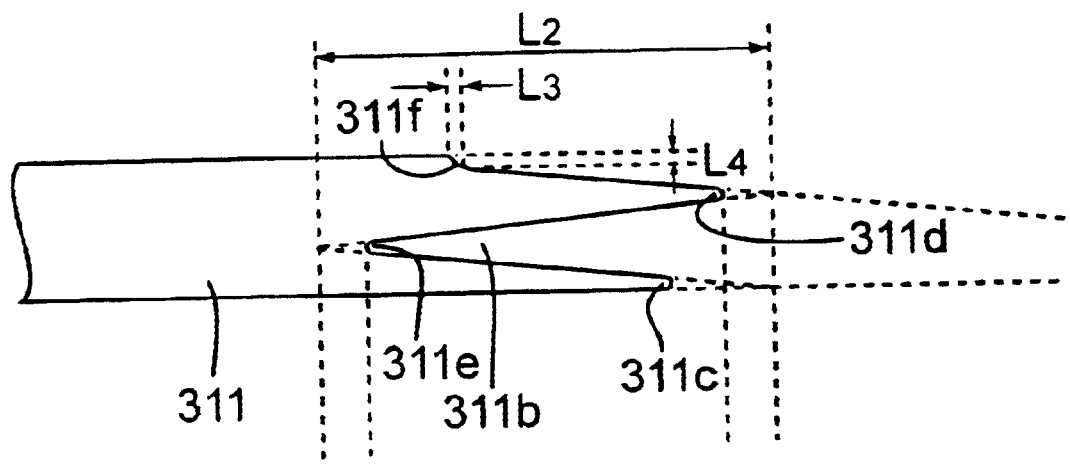
FIGS. 14(a)–14(b) are respective plan views illustrating the splitting of a pattern element as used in a modification of the fourth representative embodiment.
Figure 14B:
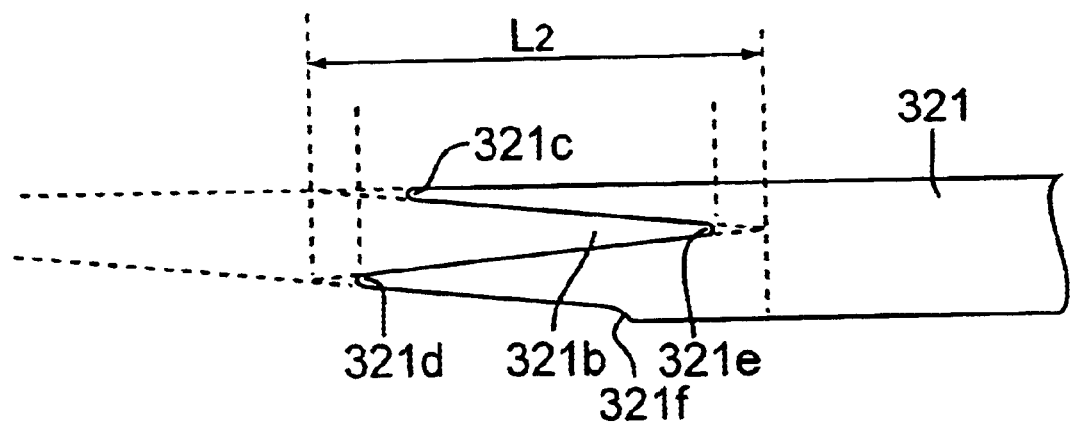

In this embodiment, similar to the second representative embodiment, pattern elements (and complementary portions thereof) can be designed with consideration given to the rounding of tips of mating ends of the pattern-element portions due to fabrication errors in the performance of the reticle-drawing apparatus. An exemplary situation is shown in FIGS. 14(a)–14(b). In FIG. 14(a), the "right-hand" mating end has rounded tips 311c, 311d and a rounded "bottom" 311e of the recession 311b. In FIG. 14(b), the "left-hand" mating end has rounded tips 321c, 321d and a rounded "bottom" 321e of the recession 321b. A first reticle subregion is prepared such that the pattern-element portion 311 includes a step 311f situated to correspond to the position of the curved tip 321c of the complementary mating end. Similarly, a second reticle subregion is prepared such that the pattern-element portion 321 includes a step 321f situated to correspond to the position of the curved tip 311c of the complementary mating end. In FIG. 14(a), the parameters $L_2$–$L_4$ of the pattern-element portions 311, 321 can be optimized using, e.g., a simulation such as that shown in FIG. 8.

Fifth Representative Embodiment

A microelectronic-device fabrication process according to a fifth representative embodiment is described with reference to FIGS. 15(a)–15(e), which depict exemplary manners in which two long, linear pattern-element portions are stitched together. The pattern element as designed has a long, linear profile similar to that shown in FIG. 15(e). This pattern element is split into two complementary pattern-element portions according to any of FIGS. 15(a)–15(d). The pattern portions can be defined on different respective regions of the same reticle or on different reticles.

FIG. 15(a) is similar to FIGS. 1(a)–1(c); in FIG. 15(a), by way of example, the length $L_1$ is 400 nm, and the width W is 100 nm. FIG. 15(a) depicts pattern-element portion 510 including a protruding mating end 510a and pattern-element portion 511 including a complementary recessed mating end 511a. FIG. 15(a) depicts the ideal situation in which the protruding mating end 510a and the complementary recessed mating end 511a have "ideal" diagonal profiles such as shown in FIGS. 1(a)–1(c).

In FIG. 15(b) the protruding mating end 520a of the pattern-element portion 520 has a tapered 5-step "staircase" profile, and the recessed mating end 521a of the pattern-element portion 521 has a complementary 5-step "staircase" profile. The width of the distal end of the protruding mating end 520a is, by way of example, 9 nm.

In FIG. 15(c) the protruding mating end 530a of the pattern-element portion 530 has a tapered 4-step "staircase" profile, and the recessed mating end 531a of the pattern-element portion 531 has a complementary 4-step "staircase" profile. The width of the distal end of the protruding mating end 530a is, by way of example, 11 nm.

In FIG. 15(d) the protruding mating end 540a of the pattern-element portion 540 has a tapered 3-step "staircase" profile, and recessed mating end 541a of the pattern-element portion 541 has a complementary 3-step "staircase" profile. The width of the distal end of the protruding mating end 540a is, by way of example, 14 nm.

Commercially available electron-beam writing apparatus used for defining a pattern on a reticle write the pattern by sequentially irradiating an electron spot beam in the perpendicular X- and Y-directions. As a result, writing a line in a direction diagonal to either of these directions is difficult using such an apparatus. Hence, defining the mating ends with "staircase" profiles according to this embodiment simplifies the task of writing the reticle pattern. In addition, in most cases, it is useful to define the distal end of the protruding mating end at least approximately as a rectangle, which is easily accomplished by using staircase profiles.

As can be ascertained from the foregoing description, according to the invention, whenever pattern elements are split on a reticle into pattern-element portions, the respective mating ends of the pattern-element portions are configured with complementary oblique features. As a result, when the pattern-element portions are exposed onto the wafer, portions of the transferred pattern elements subjected to double exposure (due to positioning errors) are reduced in size compared to conventional methods. As a result, the variation in line width in connected regions of the transferred pattern is reduced compared to conventional methods, even with a variation in beam blur of the electron beam used to make the lithographic exposure.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A method for manufacturing a microelectronic device, in which a pattern defined on a segmented reticle is transferred to a surface of a wafer, the pattern including pattern elements split among respective reticle subregions that are individually imaged onto the wafer surface, the method comprising:

in a first reticle subregion, defining a first pattern-element portion having a line width and a respective mating end including a protrusion, the protrusion being profiled so as to exhibit increased narrowing of line width toward a distal tip of the protrusion, the protrusion having a length that is 1 to 5 times the line width of the first pattern-element portion;

in a second reticle subregion, defining a second pattern-element portion having a line width and a respective mating end including a recess having a profile that is complementary to the protrusion so that, when the first and second pattern-element portions are exposed onto the resist so as to be stitched together, the portions collectively form a contiguous pattern element, the recess having a length that is 1 to 5 times the line width of the second pattern-element portion; and using a charged particle beam, transferring the first and second reticle subregions onto the resist in a manner such that the respective mating ends of the first and second pattern-element portions are stitched together in the pattern on the wafer.

2. The method of claim 1, wherein the first and second reticle subregions are located on the same reticle.

3. The method of claim 1, wherein the first and second reticle subregions are located on different respective reticles.

4. The method of claim 1, wherein the protrusion progressively narrows toward the distal tip of the protrusion.

5. The method of claim 1, wherein the protrusion narrows in a staircase manner toward the distal tip of the protrusion.

6. A method for manufacturing a microelectronic device, in which a pattern defined on a segmented reticle is transferred to a surface of a wafer, the pattern including pattern elements split among respective reticle subregions that are individually imaged onto the wafer surface, the method comprising:

(a) in a first reticle subregion, defining a first pattern-element portion having a line width and a first mating end shaped as a recess flanked by respective protrusions, the protrusions each having a respective rounded distal tip and a respective width that progressively narrows toward the respective distal tip;

(b) in a second reticle subregion, defining a second pattern-element portion having a line width and a second mating end, the second mating end having a profile that is substantially complementary to the first mating end, the second mating end including (i) a step region disposed so as to be located, whenever respective images of the first and second pattern-element portions are stitched together, adjacent the respective rounded tips of the protrusions of the first mating end, and (ii) a protrusion extending from the step region and disposed so as to be located, whenever respective images of the first and second pattern-element portions are stitched together, in the recess of the first mating end; and (c) using the charged-particle-beam lithographic-exposure apparatus, transferring the first and second reticle subregions onto the resist in a manner such that the first and second mating ends are stitched together in the pattern on the wafer.

7. The method of claim 6, wherein:

in step (a) the recess in the first mating end is defined with a length that is 1 to 5 times the line width of the first pattern-element portion; and in step (b) the protrusion of the second mating end is defined with a length of 1 to 5 times the line width of the second pattern-element portion.

8. The method of claim 6, wherein:

the protrusions of the first mating end narrow in a staircase manner toward the respective distal tip; and the protrusion of the second mating end narrows in a staircase manner toward a respective distal tip.

9. A method for manufacturing a microelectronic device, in which a pattern defined on a segmented reticle is transferred to a surface of a wafer, the pattern including pattern elements split among respective reticle subregions that are individually imaged onto the wafer surface, the method comprising:

(a) in a first reticle subregion, defining a first pattern-element portion having a line width and a respective mating end defining a respective protrusion extending at an oblique angle relative to a longitudinal direction of the first pattern-element portion and progressively narrowing toward a distal tip of the protrusion;

(b) in a second reticle subregion, defining a second pattern-element portion having a line width and a respective mating end defining a respective protrusion extending at an oblique angle relative to a longitudinal direction of the second pattern-element portion and having a profile that is complementary to the protrusion of the mating end of the first pattern-element portion; and (c) using the charged-particle-beam lithographic-exposure apparatus, transferring the first and second reticle subregions onto the resist in a manner such that the respective mating ends of the first and second pattern-element portions are stitched together in the pattern on the wafer.

10. The method of claim 9, wherein:

in step (a) the protrusion of the mating end of the first pattern-element portion is defined such that the distal tip of the protrusion is rounded, wherein the protrusion of the first pattern-element portion includes a proximal step region situated so as to be adjacent the rounded distal tip of the protrusion of the mating end of the second pattern-element portion whenever the first and second pattern-element portions are stitched together on the wafer; and in step (b) the protrusion of the mating end of the second pattern-element portion is defined such that the distal tip of the protrusion is rounded, wherein the protrusion of the second pattern-element portion includes a proximal step region situated so as to be adjacent the rounded distal tip of the protrusion of the mating end of the first pattern-element portion whenever the first and second pattern-element portions are stitched together on the wafer.

11. The method of claim 9, wherein:

in step (a) the protrusion of the first pattern-element portion is defined with a length of 1 to 5 times the line width of the first pattern-element portion; and in step (b) the protrusion of the second pattern-element portion is defined with a length of 1 to 5 times the line width of the second pattern-element portion.

12. The method of claim 9, wherein:

the protrusion of the first mating end narrows in a staircase manner toward the respective distal tip; and the protrusion of the second mating end narrows in a staircase manner toward a respective distal tip.

13. A method for manufacturing a microelectronic device, in which a pattern defined on a segmented reticle is transferred to a surface of a wafer, the pattern including pattern elements split among respective reticle subregions that are individually imaged onto the wafer surface, the method comprising:

(a) in a first reticle subregion, defining a first pattern-element portion having a line width and a respective mating end including a respective protrusion having an edge extending obliquely to a length dimension of the first pattern-element portion, the protrusion including a respective recess;

(b) in a second reticle subregion, defining a second pattern-element portion having a line width and a respective mating end that is complementary to the mating end of the first pattern-element portion; and (c) using the charged-particle-beam lithographic-exposure apparatus, transferring the first and second reticle subregions onto the resist in a manner such that the respective mating ends of the first and second pattern-element portions are stitched together in the pattern on the wafer.

14. The method of claim 13, wherein:

in step (a) the recess defined in the protrusion of the mating end of the first pattern-element portion divides the respective protrusion into first and second protrusion portions that flank the recess, each protrusion portion having a respective rounded distal end;

in step (b) the mating end of the second pattern-element portion is defined to include a respective protrusion having an edge extending obliquely to a length dimension of the second pattern-element portion, the protrusion including a recess that divides the respective protrusion into first and second protrusion portions that flank the recess, each protrusion portion having a respective rounded distal end;

in step (a) the obliquely extending edge includes a respective step region situated so as to be located adjacent a rounded tip of a protrusion portion of the mating end of the second pattern-element portion when the first and second pattern-element portions are stitched together on the wafer; and in step (b) the obliquely extending edge includes a respective step region situated so as to be located adjacent a rounded tip of a protrusion portion of the mating end of the first pattern-element portion when the first and second pattern-element portions are stitched together on the wafer.

15. The method of claim 13, wherein, in step (a) the recess defined in the protrusion of the mating end of the first pattern-element portion is defined to have a length of 1 to 5 times the line width of the first pattern-element portion.

16. The method of claim 13, wherein the protrusion of the first mating end narrows in a staircase manner toward a respective distal tip.

17. A charged-particle-beam lithographic-exposure method for transferring a pattern to a resist layer on a wafer, the pattern being divided into multiple reticle subregions defining respective portions of the pattern, the subregions being exposed onto the onto the resist layer such that respective images of the reticle subregions are stitched together to form the pattern on the wafer, the method comprising:

in a first reticle subregion, defining a first pattern-element portion having a line width and a respective first mating end at an edge of the first reticle subregion, the mating end including a protrusion profiled so as to exhibit increased narrowing of line width toward a distal tip of the protrusion, the protrusion having a length that is 1 to 5 times the line width of the first pattern-element portion;

in a second reticle subregion, defining a second pattern-element portion having a line width and a respective second mating end at an edge of the second reticle subregion adjacent the edge of the first reticle subregion, the second mating end including a recess having a profile that is complementary to the protrusion and having a length that is 1 to 5 times the line width of the second pattern-element portion; and using a charged particle beam, transferring respective images of the first and second reticle subregions onto the resist such that the images are stitched together edge-to-edge with the respective mating ends of the first and second pattern-element portions stitched together to form a contiguous pattern element.

18. The method of claim 17, wherein the first and second reticle subregions are located on the same reticle.

19. The method of claim 17, wherein the first and second reticle subregions are located on different respective reticles.

20. The method of claim 17, wherein the protrusion is profiled exhibit progressive narrowing toward the distal tip of the protrusion.

21. The method of claim 17, wherein the protrusion is profiled so as to narrow in a staircase manner toward the distal tip of the protrusion.

22. A charged-particle-beam lithographic-exposure method for transferring a pattern to a resist layer on a wafer, the pattern being divided into multiple reticle subregions defining respective portions of the pattern, the subregions being exposed onto the onto the resist layer such that respective images of the reticle subregions are stitched together to form the pattern on the wafer, the method comprising:

(a) in a first reticle subregion, defining a first pattern-element portion having a line width and a respective first mating end at an edge of the first reticle subregion, the first mating end being profiled as a recess flanked by respective protrusions each having a respective rounded distal tip and a respective width exhibiting increased narrowing of width toward the respective distal tip;

(b) in a second reticle subregion, defining a second pattern-element portion having a line width and a respective second mating end at an edge of the second reticle subregion, the second mating end having a profile that is substantially complementary to the profile of the first mating end; and (c) using a charged particle beam, transferring respective images of the first and second reticle subregions onto the resist such that the images are stitched together edge-to-edge with the respective mating ends of the first and second pattern-element portions stitched together to form a contiguous pattern element.

23. The method of claim 22, wherein, in step (b) the second mating end is profiled to include (i) a step region disposed so as to be located, whenever respective images of the first and second pattern-element portions are transferred onto the resist, adjacent the respective rounded tips of the protrusions of the first mating end, and (ii) a protrusion extending from the step region and disposed so as to be located, whenever respective images of the first and second pattern-element portions are stitched together, in the recess of the first mating end.

24. The method of claim 22, wherein:

in step (a) the length of the recess is 1 to 5 times the line width of the first pattern-element portion; and in step (b) the length of a protrusion of the second mating end complementary to the recess in the first mating end is 1 to 5 times the line width of the second pattern-element portion.

25. The method of claim 22, wherein:

in step (a) the protrusions in the first mating end are profiled so as to exhibit progressive narrowing toward the respective distal tips of the protrusions; and in step (b) the protrusion in the second mating end is profiled so as to exhibit progressive narrowing toward the distal tip of the protrusion.

26. The method of claim 22, wherein:
in step (a) the protrusions in the first mating end are profiled so as to narrow in a staircase manner toward the respective distal tips of the protrusions; and
in step (b) the protrusion in the second mating end is profiled so as to narrow in a staircase manner toward the respective distal tip of the protrusion.

27. A charged-particle-beam lithographic-exposure method for transferring a pattern to a resist layer on a wafer, the pattern being divided into multiple reticle subregions defining respective portions of the pattern, the subregions being exposed onto the onto the resist layer such that respective images of the reticle subregions are stitched together to form the pattern on the wafer, the method comprising:
(a) in a first reticle subregion, defining a first pattern-element portion having a line width and a respective first mating end at an edge of the first reticle subregion, the first mating end being profiled with a respective protrusion extending at an oblique angle relative to a longitudinal direction of the first pattern-element portion and exhibiting increased narrowing of line width toward a distal tip of the protrusion;
(b) in a second reticle subregion, defining a second pattern-element portion having a line width and a respective second mating end at an edge of the second reticle subregion, the second mating end having a profile that is substantially complementary to the profile of the first mating end; and
(c) using the charged-particle-beam lithographic-exposure apparatus, transferring the first and second reticle subregions onto the resist in a manner such that the respective mating ends of the first and second pattern-element portions are stitched together in the pattern on the wafer.

28. The method of claim 27, wherein:
in step (a) the protrusion of the first mating end is profiled such that its distal tip is rounded;
in step (b) the second mating end is profiled so as to have a protrusion, complementary to the protrusion of the first mating end, profiled such that its distal tip is rounded;
in step (a) the protrusion of the first mating end is additionally profiled to include a proximal step region configured to be situated adjacent the rounded distal tip of the protrusion of the second mating end whenever the first and second reticle subregions are imaged in a stitched-together manner on the resist; and
in step (b) the protrusion of the second mating end is additionally profiled to include a proximal step region configured to be situated adjacent the rounded distal tip of the protrusion of the first mating end whenever the first and second reticle subregions are imaged in a stitched-together manner on the resist.

29. The method of claim 27, wherein:
in step (a) the protrusion of the first pattern-element portion is defined with a length of 1 to 5 times the line width of the first pattern-element portion; and
in step (b) the protrusion of the second pattern-element portion is defined with a length of 1 to 5 times the line width of the second pattern-element portion.

30. The method of claim 27, wherein:
the protrusion of the first mating end narrows in a staircase manner toward the respective distal tip; and
the protrusion of the second mating end narrows in a staircase manner toward a respective distal tip.

31. A charged-particle-beam lithographic-exposure method for transferring a pattern to a resist layer on a wafer, the pattern being divided into multiple reticle subregions defining respective portions of the pattern, the subregions being exposed onto the onto the resist layer such that respective images of the reticle subregions are stitched together to form the pattern on the wafer, the method comprising:
(a) in a first reticle subregion, defining a first pattern-element portion having a line width and a respective first mating end at an edge of the first reticle subregion, the first mating end being profiled with a respective protrusion having an edge extending obliquely to a length dimension of the first pattern-element portion, the protrusion including a respective recess;
(b) in a second reticle subregion, defining a second pattern-element portion having a line width and a respective second mating end at an edge of the second reticle subregion, the second mating end having a profile that is substantially complementary to the profile of the first mating end; and
(c) using the charged-particle-beam lithographic-exposure apparatus, transferring the first and second reticle subregions onto the resist in a manner such that the respective mating ends of the first and second pattern-element portions are stitched together in the pattern on the wafer.

32. The method of claim 31, wherein:
in step (a) the recess defined in the protrusion of the mating end of the first pattern-element portion divides the respective protrusion into first and second protrusion portions that flank the recess, each protrusion portion having a respective rounded distal end;
in step (b) the mating end of the second pattern-element portion is defined to include a respective protrusion having an edge extending obliquely to a length dimension of the second pattern-element portion, the protrusion including a recess that divides the respective protrusion into first and second protrusion portions that flank the recess, each protrusion portion having a respective rounded distal end;
in step (a) the obliquely extending edge includes a respective step region situated so as to be located adjacent a rounded tip of a protrusion portion of the mating end of the second pattern-element portion when the first and second pattern-element portions are stitched together on the wafer; and
in step (b) the obliquely extending edge includes a respective step region situated so as to be located adjacent a rounded tip of a protrusion portion of the mating end of the first pattern-element portion when the first and second pattern-element portions are stitched together on the wafer.

33. The method of claim 31, wherein, in step (a) the recess defined in the protrusion of the mating end of the first pattern-element portion is defined to have a length of 1 to 5 times the line width of the first pattern-element portion.

34. The method of claim 31, wherein the protrusion of the first mating end narrows in a staircase manner toward a respective distal tip.

35. In a method for fabricating a segmented reticle for use in charged-particle-beam microlithography of a pattern onto a surface of a lithographic substrate, a method for dividing the pattern to be defined on the reticle, comprising:
in a first reticle subregion, defining a first pattern-element portion having a line width and a respective mating end including a protrusion, the protrusion being profiled so as to exhibit increased narrowing of line width toward a distal tip of the protrusion, the protrusion having a length that is 1 to 5 times the line width of the first pattern-element portion; and in a second reticle subregion, defining a second pattern-element portion having a line width and a respective mating end including a recess having a profile that is complementary to the protrusion so that, when the first and second pattern-element portions are exposed onto the resist so as to be stitched together, the portions collectively form a contiguous pattern element, the recess having a length that is 1 to 5 times the line width of the second pattern-element portion.

36. The method of claim 35, wherein the first and second reticle subregions are located on the same reticle.

37. The method of claim 35, wherein the first and second reticle subregions are located on different respective reticles.

38. The method of claim 35, wherein the protrusion progressively narrows toward the distal tip of the protrusion.

39. The method of claim 35, wherein the protrusion narrows in a staircase manner toward the distal tip of the protrusion.

40. In a method for fabricating a segmented reticle for use in charged-particle-beam microlithography of a pattern onto a surface of a lithographic substrate, a method for dividing the pattern to be defined on the reticle, comprising:

(a) in a first reticle subregion, defining a first pattern-element portion having a line width and a first mating end shaped as a recess flanked by respective protrusions, the protrusions each having a respective rounded distal tip and a respective width that progressively narrows toward the respective distal tip; and (b) in a second reticle subregion, defining a second pattern-element portion having a line width and a second mating end, the second mating end having a profile that is substantially complementary to the first mating end, the second mating end including (i) a step region disposed so as to be located, whenever respective images of the first and second pattern-element portions are stitched together, adjacent the respective rounded tips of the protrusions of the first mating end, and (ii) a protrusion extending from the step region and disposed so as to be located, whenever respective images of the first and second pattern-element portions are stitched together, in the recess of the first mating end.

41. The method of claim 40, wherein:

in step (a) the recess in the first mating end is defined with a length that is 1 to 5 times the line width of the first pattern-element portion; and in step (b) the protrusion of the second mating end is defined with a length of 1 to 5 times the line width of the second pattern-element portion.

42. The method of claim 40, wherein:

the protrusions of the first mating end narrow in a staircase manner toward the respective distal tip; and the protrusion of the second mating end narrows in a staircase manner toward a respective distal tip.

43. In a method for fabricating a segmented reticle for use in charged-particle-beam microlithography of a pattern onto a surface of a lithographic substrate, a method for dividing the pattern to be defined on the reticle, comprising:

(a) in a first reticle subregion, defining a first pattern-element portion having a line width and a respective mating end defining a respective protrusion extending at an oblique angle relative to a longitudinal direction of the first pattern-element portion and progressively narrowing toward a distal tip of the protrusion; and (b) in a second reticle subregion, defining a second pattern-element portion having a line width and a respective mating end defining a respective protrusion extending at an oblique angle relative to a longitudinal direction of the second pattern-element portion and having a profile that is complementary to the protrusion of the mating end of the first pattern-element portion.

44. The method of claim 43, wherein:

in step (a) the protrusion of the mating end of the first pattern-element portion is defined such that the distal tip of the protrusion is rounded, wherein the protrusion of the first pattern-element portion includes a proximal step region situated so as to be adjacent the rounded distal tip of the protrusion of the mating end of the second pattern-element portion whenever the first and second pattern-element portions are stitched together on the wafer; and in step (b) the protrusion of the mating end of the second pattern-element portion is defined such that the distal tip of the protrusion is rounded, wherein the protrusion of the second pattern-element portion includes a proximal step region situated so as to be adjacent the rounded distal tip of the protrusion of the mating end of the first pattern-element portion whenever the first and second pattern-element portions are stitched together on the wafer.

45. The method of claim 43, wherein:

in step (a) the protrusion of the first pattern-element portion is defined with a length of 1 to 5 times the line width of the first pattern-element portion; and in step (b) the protrusion of the second pattern-element portion is defined with a length of 1 to 5 times the line width of the second pattern-element portion.

46. The method of claim 43, wherein:

the protrusion of the first mating end narrows in a staircase manner toward the respective distal tip; and the protrusion of the second mating end narrows in a staircase manner toward a respective distal tip.

47. In a method for fabricating a segmented reticle for use in charged-particle-beam microlithography of a pattern onto a surface of a lithographic substrate, a method for dividing the pattern to be defined on the reticle, comprising:

(a) in a first reticle subregion, defining a first pattern-element portion having a line width and a respective mating end including a respective protrusion having an edge extending obliquely to a length dimension of the first pattern-element portion, the protrusion including a respective recess; and (b) in a second reticle subregion, defining a second pattern-element portion having a line width and a respective mating end that is complementary to the mating end of the first pattern-element portion.

48. The method of claim 47, wherein:

in step (a) the recess defined in the protrusion of the mating end of the first pattern-element portion divides the respective protrusion into first and second protrusion portions that flank the recess, each protrusion portion having a respective rounded distal end;

in step (b) the mating end of the second pattern-element portion is defined to include a respective protrusion having an edge extending obliquely to a length dimension of the second pattern-element portion, the protrusion including a recess that divides the respective protrusion into first and second protrusion portions that flank the recess, each protrusion portion having a respective rounded distal end;

in step (a) the obliquely extending edge includes a respective step region situated so as to be located adjacent a rounded tip of a protrusion portion of the mating end of the second pattern-element portion when the first and second pattern-element portions are stitched together on the wafer; and in step (b) the obliquely extending edge includes a respective step region situated so as to be located adjacent a rounded tip of a protrusion portion of the mating end of the first pattern-element portion when the first and second pattern-element portions are stitched together on the wafer.

49. The method of claim 47, wherein, in step (a) the recess defined in the protrusion of the mating end of the first pattern-element portion is defined to have a length of 1 to 5 times the line width of the first pattern-element portion.

50. The method of claim 47, wherein the protrusion of the first mating end narrows in a staircase manner toward a respective distal tip.

51. A microelectronic device, fabricated by a method as recited in claim 1.

52. A microelectronic device, fabricated by a method as recited in claim 6.

53. A microelectronic device, fabricated by a method as recited in claim 9.

54. A microelectronic device, fabricated by a method as recited in claim 13.

55. A reticle, produced by a method as recited in claim 35.

56. A reticle, produced by a method as recited in claim 40.

57. A reticle, produced by a method as recited in claim 43.

58. A reticle, produced by a method as recited in claim 47.

* * * * *

UNITED STATES PATENT AND TRADEMARK OFFICE
CERTIFICATE OF CORRECTION

PATENT NO.    : 6,656,663 B2
DATED         : December 2, 2003
INVENTOR(S)   : Fujiwara It is certified that error appears in the above-identified patent and that said Letters Patent is hereby corrected as shown below:

Column 5,
Line 63, "mating end" should read -- mating ends --.

Column 9,
Line 23, "result, so that there is" should read -- result, there is --.

Column 10,
Line 50, "FIG. 7(a) is" should read -- FIG. 7(a)) is --.

Column 17
Line 45, "exposed onto the onto the resist" should read -- exposed onto the resist --.

Column 18,
Line 9, "profiled exhibit progressive" should read -- profiled to exhibit progressive --.
Line 18, "exposed onto the onto the resist" should read -- exposed onto the resist --

Column 19,
Line 12, "exposed onto the onto the resist" should read -- exposed onto the resist --.

Column 20,
Line 5, "exposed onto the onto the resist" should read -- exposed onto the resist --.

Signed and Sealed this

Fifteenth Day of February, 2005

JON W. DUDAS
*Director of the United States Patent and Trademark Office*